United States Patent
Yoshida

(10) Patent No.: US 9,184,080 B2
(45) Date of Patent: Nov. 10, 2015

(54) APPARATUS FOR TRANSFERRING SUBSTRATE, SUBSTRATE PROCESSING SYSTEM, METHOD FOR TRANSFERRING SUBSTRATE AND MEMORY MEDIUM

(71) Applicant: TOKYO ELECTRON LIMITED, Minato-ku (JP)

(72) Inventor: Masahiro Yoshida, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 39 days.

(21) Appl. No.: 14/206,091

(22) Filed: Mar. 12, 2014

(65) Prior Publication Data
US 2014/0277690 A1 Sep. 18, 2014

(30) Foreign Application Priority Data
Mar. 12, 2013 (JP) ................. 2013-049402

(51) Int. Cl.
*G06F 7/00* (2006.01)
*G06F 19/00* (2011.01)
*H01L 21/677* (2006.01)
*H01L 21/67* (2006.01)

(52) U.S. Cl.
CPC .... *H01L 21/67781* (2013.01); *H01L 21/67265* (2013.01)

(58) Field of Classification Search
None
See application file for complete search history.

(56) References Cited

U.S. PATENT DOCUMENTS 7,751,922 B2 * 7/2010 Hirano et al. ................. 700/112

FOREIGN PATENT DOCUMENTS

| JP | 2003-168715 | 6/2003 |
|----|-------------|--------|
| JP | 2012-015530 A | 1/2012 |
| JP | 2012-222254 | 11/2012 |
| WO | WO 2006/038584 | 4/2006 |

* cited by examiner

*Primary Examiner* — Yolanda Cumbess
(74) *Attorney, Agent, or Firm* — Oblon, McClelland, Maier & Neustadt, L.L.P.

(57) ABSTRACT

A substrate transfer apparatus includes a substrate transfer device which loads and unloads multiple substrates into and from a cassette capable of accommodating the multiple substrates, a substrate detector device which detects the positions of the substrates in the cassette, and a control device which controls the transfer device. The control device includes a computation component which calculates a shifted amount between a base position and the position of each substrate such that the shifted amount from the base position is set as a positive value, a verification component which verifies whether the difference between the maximum and minimum values among the shifted amounts is equal to or less a threshold value, and a transfer control component which controls the transfer device such that the transfer device unloads the substrates from the cassette when the verification component verifies that the difference is equal to or less than the threshold value.

20 Claims, 10 Drawing Sheets

APPARATUS FOR TRANSFERRING SUBSTRATE, SUBSTRATE PROCESSING SYSTEM, METHOD FOR TRANSFERRING SUBSTRATE AND MEMORY MEDIUM

CROSS-REFERENCE TO RELATED APPLICATIONS

The present application is based upon and claims the benefit of priority to Japanese Patent Application No. 2013-049402, filed Mar. 12, 2013, the contents of which are incorporated herein by reference.

BACKGROUND OF THE INVENTION

1. Field of the Invention

The embodiments described below relate to a substrate transfer apparatus, a substrate processing apparatus, a method for unloading a substrate, and a memory medium.

2. Description of Background Art

For performing treatment such as cleaning and the like on a substrate, a substrate processing apparatus successively takes wafers out of a cassette in which multiple substrates are accommodated and transfers them to a processing section and performs treatment on the substrate in the processing section (see JP2012-222254 A, for example).

In such a substrate processing apparatus, if the amounts of positional shifting of all the substrates in a cassette detected by a mapping process are within a predetermined range, the substrates are unloaded from the cassette, but if the positional shifting of any substrate is beyond the predetermined range, the apparatus determines there is an abnormality and thus cancels the unloading process of the wafers from the cassette. The entire contents of this publication are incorporated herein by reference.

SUMMARY OF THE INVENTION

According to one aspect of the present invention, a substrate transfer apparatus includes a substrate transfer device which loads and unloads multiple substrates into and from a cassette capable of accommodating the multiple substrates, a substrate detector device which detects the positions of the substrates accommodated in the cassette, and a control device which controls the substrate transfer device. The control device includes a computation component which calculates a shifted amount between a base position and the position of each of the substrates detected by the substrate detector device such that the shifted amount of an upward or downward shift from the base position is set as a positive value, a verification component which verifies whether the difference between the maximum and minimum values among the shifted amounts calculated by the computation component is equal to or less a threshold value, and a transfer control component which controls the substrate transfer device such that the substrate transfer device unloads the substrates from the cassette when the verification component verifies that the difference between the maximum and minimum values is equal to or less than the threshold value.

According to another aspect of the present invention, a substrate processing system includes a substrate transfer apparatus which loads multiple substrates from outside, a substrate processing apparatus which treats the substrates loaded by the substrate transfer apparatus, and a delivery apparatus which delivers the substrates loaded by the substrate transfer apparatus to the substrate processing apparatus. The substrate transfer apparatus includes a substrate transfer device which loads and unloads the multiple substrates into and from a cassette capable of accommodating the multiple substrates, a substrate detector device which detects the positions of the substrates accommodated in the cassette, and a control device which controls the substrate transfer device. The control device includes a computation component which calculates a shifted amount between a base position and the position of each of the substrates detected by the substrate detector device such that the shifted amount of an upward or downward shift from the base position is set as a positive value, a verification component which verifies whether the difference between the maximum and minimum values among the shifted amounts calculated by the computation component is equal to or less a threshold value, and a transfer control component which controls the substrate transfer device such that the substrate transfer device unloads the substrates from the cassette when the verification component verifies that the difference between the maximum and minimum values is equal to or less than the threshold value.

According to yet another aspect of the present invention, a method for unloading substrates includes detecting the positions of multiple substrates accommodated in a cassette by a substrate detector device, calculating a shifted amount between a base position and the position of each of the substrates detected by the substrate detector device such that the shifted amount of an upward or downward shift from the base position is set as a positive value, verifying whether the difference between the maximum and minimum values among the shifted amounts calculated by the computation component is equal to or less a threshold value, and controlling a substrate transfer device such that the substrate transfer device unloads the substrates from the cassette when the verification component verifies that the difference between the maximum and minimum values is equal to or less than the threshold value.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE EMBODIMENTS

Figure 1:
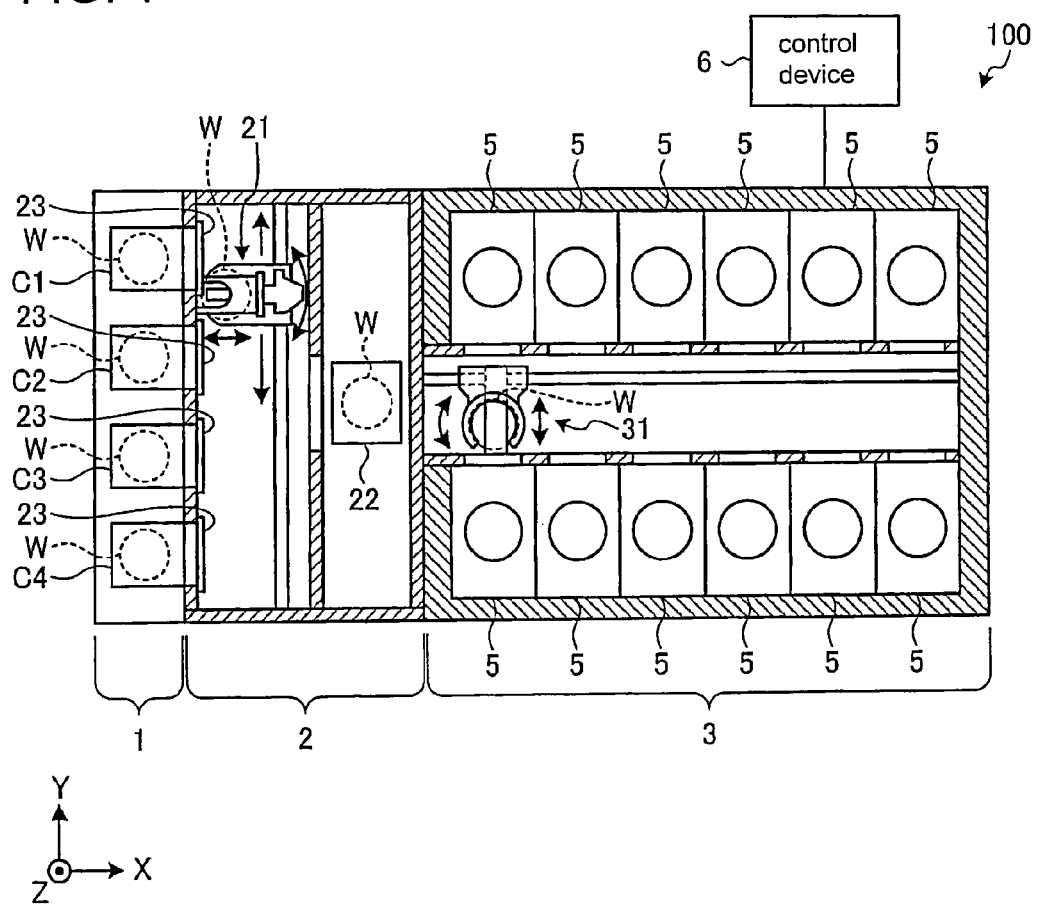
FIG. 1 is a view schematically showing a structure of a substrate processing apparatus according to a first embodiment.

The embodiments will now be described with reference to the accompanying drawings, wherein like reference numerals designate corresponding or identical elements throughout the various drawings.

First Embodiment

First, a schematic structure of a substrate processing apparatus according to a first embodiment is described by referring to FIG. 1. FIG. 1 is a view schematically showing a structure of the substrate processing apparatus according to the first embodiment.

In the following, to clarify positional relationships, axes (X, Y, Z) orthogonal to each other are determined, and a positive Z direction is set to be perpendicular upward to the XY plane. In addition, a negative X direction is set toward the front of a substrate processing apparatus, and a positive X direction is set toward the rear of the substrate processing apparatus in the following.

As shown in FIG. 1, substrate processing apparatus 100 has loading/unloading station 1, transfer station 2 and processing station 3. Loading/unloading station 1, transfer station 2 and processing station 3 are set in position from the front toward the rear of substrate processing apparatus 100 in the order of loading/unloading station 1, transfer station 2 and processing station 3.

Loading/unloading station 1 is where multiple cassettes are located; for example, four cassettes (C1~C4) are provided side by side while being positioned immediately adjacent to the front wall of transfer station 2. Cassettes (C1~C4) are each an accommodation container capable of horizontally accommodating multiple wafers (W) on multiple shelves.

Transfer station 2 is positioned in the rear of loading/unloading station 1, and is provided with substrate transfer device 21 and substrate delivery stage 22. On substrate delivery stage 22, a buffer cassette (not shown) is located to temporarily accommodate multiple wafers (W).

Substrate transfer device 21 transfers wafers (W) between cassettes (C1~C4) in loading/unloading station 1 and the buffer cassette on substrate delivery stage 22.

Substrate transfer device 21 has a transfer arm capable of horizontally moving, vertically ascending/descending, and rotating around a vertical axis; and has a substrate holding component provided at the tip of the transfer arm. Substrate transfer device 21 holds a wafer (W) by using the substrate holding component, and uses the transfer arm to transfer the held wafer (W) to a desired position. More specifically, substrate transfer device 21 unloads a wafer from a cassette (C1, C2, C3 or C4) and accommodates the wafer into a buffer cassette, and also unloads a wafer (W) from the buffer cassette and returns the wafer to the cassette (C1, C2, C3 or C4).

Moreover, substrate detector device 23 is provided for each of cassettes (C1~C4) to detect wafers (W) accommodated in cassettes (C1~C4).

Figure 2A:
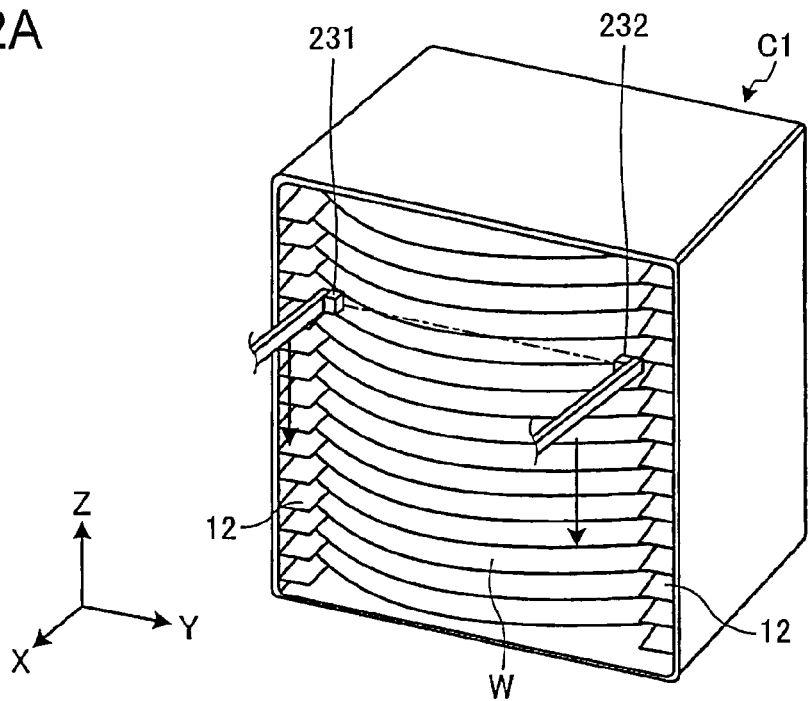
FIG. 2A is a view schematically showing a structure of a cassette and a substrate detector device.
Figure 2B:
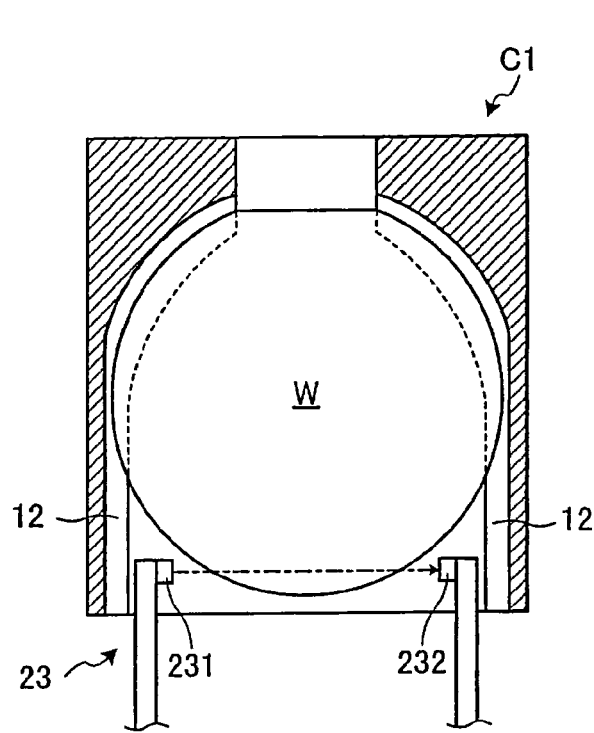
FIG. 2B is a view schematically showing a structure of the cassette and the substrate detector device.

In the following, schematic structures of a cassette (C1, C2, C3 or C4) and of substrate detector device 23 are described with reference to FIGS. 2A and 2B. FIGS. 2A and 2B schematically show the structures of a cassette (C1, C2, C3 or C4) and of substrate detector device 23. An example shown in FIG. 2A illustrates substrate detector device 23 provided for cassette (C1).

As shown in FIG. 2A, cassette (C1) is a box-type case having an opening on the side facing the transfer station 2 (positive X direction side). The width from left to right of cassette (C1) is slightly greater than the measurement of a wafer (W). In addition, the depth is set long enough relative to the measurement of a wafer (W) so as to prevent a wafer (W) from jutting out of the opening.

Provided inside cassette (C1) are a support portion positioned at the opposite side of the opening portion (not shown) that supports an edge of a wafer (W) and a pair of support portions (12, 12) that support right and left edges of the wafer (W). When a wafer (W) is supported by those support portions 12, the wafer (W) is set to be accommodated horizontally in cassette (C1).

Cassettes (C2~C4) are each structured the same as cassette (C1). In the example here, cassettes (C1~C4) are each set to accommodate 15 wafers (W). However, the number of wafers (W) set to be accommodated in each of cassettes (C1~C4) is not limited to 15.

As shown in FIGS. 2A and 2B, substrate detector device 23 is provided with light emitter 231 which emits light, light receiver 232 which receives the light emitted from light emitter 231, and a moveable portion (not shown) which moves light emitter 231 and light receiver 232 in a vertical direction. Light emitter 231 and light receiver 232 are horizontally positioned to face each other on the left and right sides of the opening of cassette (C1).

While light emitter 231 keeps emitting light, substrate detector device 23 vertically moves light emitter 231 and light receiver 232 using the moveable portion not shown in the drawings. When there is no wafer (W) between light emitter 231 and light receiver 232, the light emitted from light emitter 231 is received by light receiver 232. On the other hand, when a wafer (W) is present between light emitter 231 and light receiver 232, the light emitted from light emitter 231 is blocked by the wafer (W) and does not reach light receiver 232. Thereby, substrate detector device 23 detects the wafer (W) accommodated in cassette (C1).

Based on detection signals (S) that are output from substrate detector device 23, later-described control device 6 performs a mapping process that calculates the position of each wafer (W), the thickness of each wafer (W), the pitch between wafers (W) and the like. Details are provided later.

In the example here, a transmission-type optical sensor is provided in substrate detector device 23. However, that is not the only option and substrate detector device 23 may have a reflection-type optical sensor.

Figure 3A:
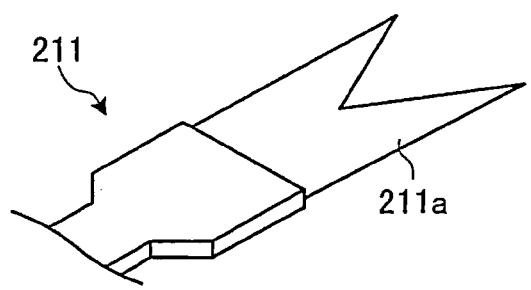
FIG. 3A is a perspective view schematically showing a first holding component provided in a substrate transfer device.

The structure of a substrate holding component provided in substrate transfer device 21 is described with reference to FIGS. 3A and 3B. FIG. 3A is a perspective view schematically showing a first substrate holding component provided in substrate transfer device 21, and FIG. 3B is a perspective view schematically showing a second substrate holding component provided in substrate transfer device 21.

Figure 3B:
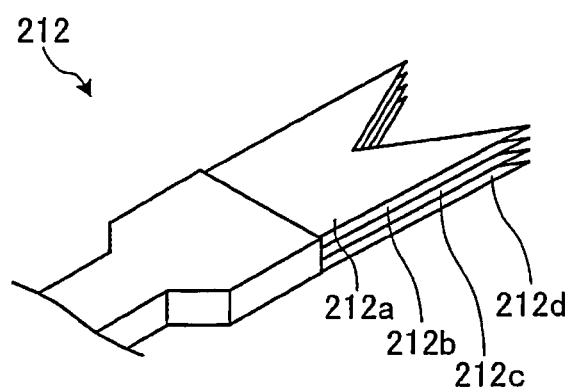
FIG. 3B is a perspective view schematically showing a second holding component provided in the substrate transfer device.

As shown in FIGS. 3A and 3B, substrate transfer device 21 has two substrate holding components—a first substrate holding component 211 and a second substrate holding component 212.

As shown in FIG. 3A, first substrate holding component 211 has one holder portion (211a), and horizontally holds a wafer (W) by using one substrate holder (211a).

As shown in FIG. 3B, second substrate holding component 212 has multiple (four, in this example) holder portions (212a~212d). Using multiple holder portions (212a~212d), the second holding component horizontally holds multiple (four, in this example) wafers (W) set vertically in multiple shelves. Second substrate holding component 212 is positioned above first substrate holding component 211. Also, first substrate holding component 211 and second substrate holding component 212 are set to be moveable independently of each other.

Holder portions (211a, 212a~212d) are each aligned at a predetermined pitch along a lamination direction of wafers (W). More specifically, the pitch of holder portions (211a, 212a~212d) in a vertical direction is approximately the same as that of paired support portions (12, 12) (see FIG. 2A) in each of cassettes (C1~C4) in a vertical direction. Using both first substrate holding component 211 and second substrate holding component 212, multiple (maximum five, in this example) wafers (W) are transferred simultaneously between a cassette (C1, C2, C3 or C4) and the buffer cassette.

The structure of processing station 3 is described by referring to FIG. 1 again. Processing station 3 is positioned in the rear of transfer station 2. In processing station 3, substrate transfer device 31 is positioned in the center, and multiple (six, in this example) substrate processing components 5 are aligned on both the left and right sides of substrate transfer device 31 in a direction of front to rear. In such a processing station 3, substrate transfer device 31 transfers wafers (W) one at a time between substrate delivery stage 22 of transfer station 2 and a substrate processing component 5. Then, each substrate processing component 5 performs substrate treatment such as cleaning on one wafer (W) at a time.

In substrate processing apparatus 100 structured as above, first, substrate transfer device 21 of transfer station 2 unloads a wafer (W) from a cassette (C1, C2, C3 or C4) positioned in loading/unloading station 1, and accommodates the unloaded wafer (W) into the buffer cassette (not shown) on substrate delivery stage 22. The wafer (W) accommodated in the buffer cassette is unloaded by substrate transfer device 31 of processing station 3, and loaded into a substrate processing component 5.

After being loaded into a substrate processing component 5, the wafer (W) is treated by the substrate processing component 5, the wafer (W) is unloaded from the substrate processing component 5 by substrate transfer device 31, and accommodated again in the buffer cassette on substrate delivery stage 22. Then, the treated wafer (W) accommodated in the buffer cassette is returned to the cassette (C1, C2, C3 or C4) by substrate transfer device 21.

Substrate processing apparatus 100 is provided with control device 6. Control device 6 controls operations performed in substrate processing apparatus 100 as described above. Control device 6 is a computer, for example, and has a controller and a memory. The memory stores a program for controlling various processes such as cleaning. The controller reads and executes the program stored in the memory to control the operations performed by substrate processing apparatus 100.

Such a program may also be stored in a memory medium readable by a computer, and installed from the memory medium into the memory of control device 6. Memory media readable by a computer are a hard disc (HD), flexible disc (FD), compact disc (CD), magneto-optical disc (MO), memory card and the like.

Figure 4:
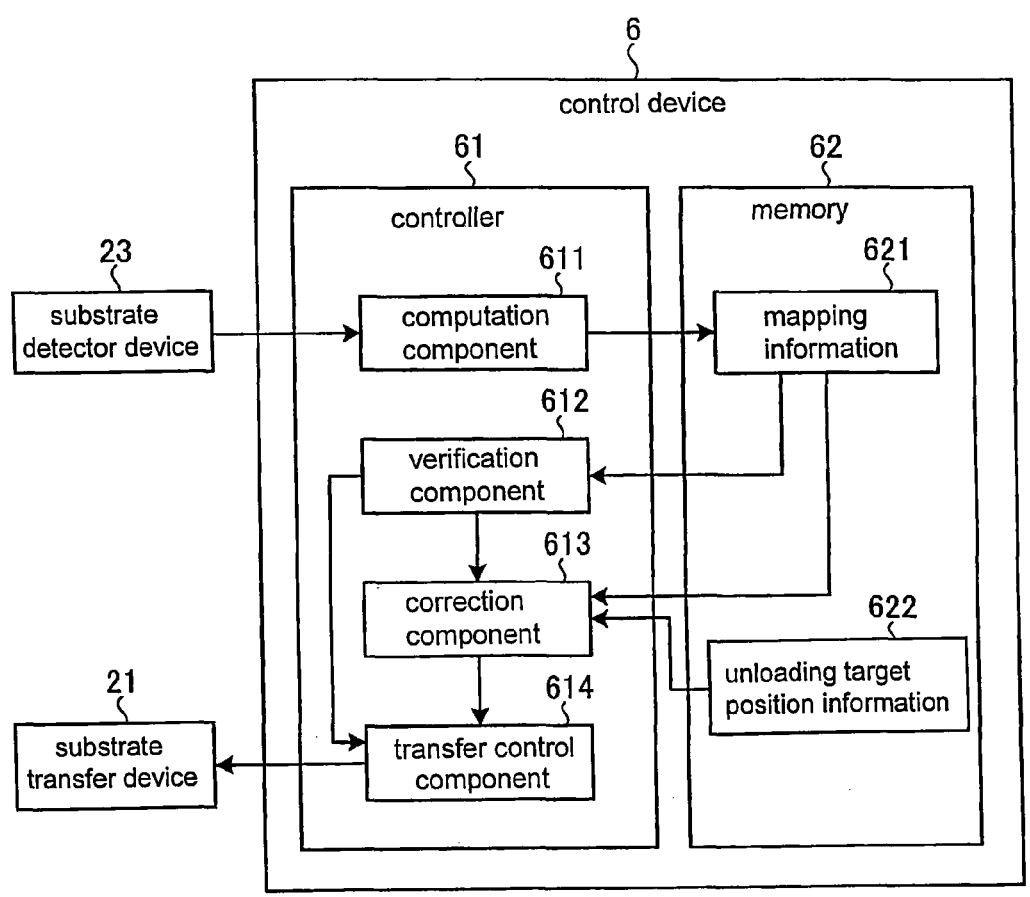
FIG. 4 is a block diagram showing a structure of the control device.

The structure of control device 6 is described with reference to FIG. 4. FIG. 4 is a block diagram to show the structure of control device 6. It is noted that FIG. 4 shows only the structural elements necessary to describe the features of control device 6, and generally included structural elements are omitted.

As shown in FIG. 4, control device 6 has controller 61 and memory 62. Based on the information stored in memory 62, controller 61 instructs substrate transfer device 21 to conduct a substrate unloading process for unloading a wafer from a cassette (C1, C2, C3 or C4) and accommodating it into the buffer cassette, and a substrate return process for taking out a wafer (W) from the buffer cassette and accommodating it into a cassette (C1, C2, C3 or C4).

The substrate transfer apparatus described in the present application is, as an example, structured to have a control device 6, a substrate transfer device 21 and a substrate detector device 23 shown in FIG. 4.

Detailed operations of substrate processing apparatus 100 are now described. First, substrate processing apparatus 100 performs a detection process to detect a wafer (W) accommodated in a cassette (C1, C2, C3 or C4) by using substrate detector device 23. Next, in substrate processing apparatus 100, substrate transfer device 21 performs a substrate unloading process following instructions from control device 6 to unload a wafer (W) from a cassette (C1, C2, C3 or C4) and accommodate the wafer (W) into the buffer cassette on substrate delivery stage 22.

Such a substrate unloading process is now described specifically. As shown in FIG. 4, controller 61 of control device 6 has computation component 611, verification component 612, correction component 613 and transfer control component 614. Also, memory 62 stores mapping information 621 and target unloading position information 622.

Figure 5A:
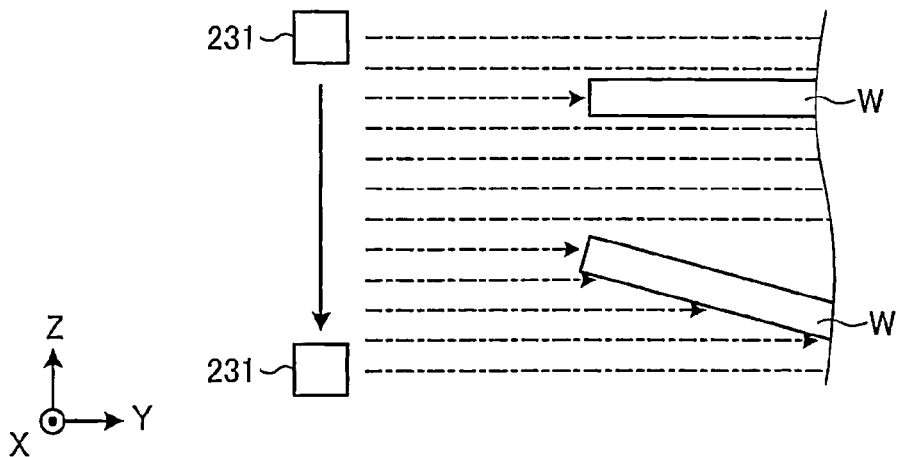
FIG. 5A is a view illustrating a mapping process.
Figure 5B:
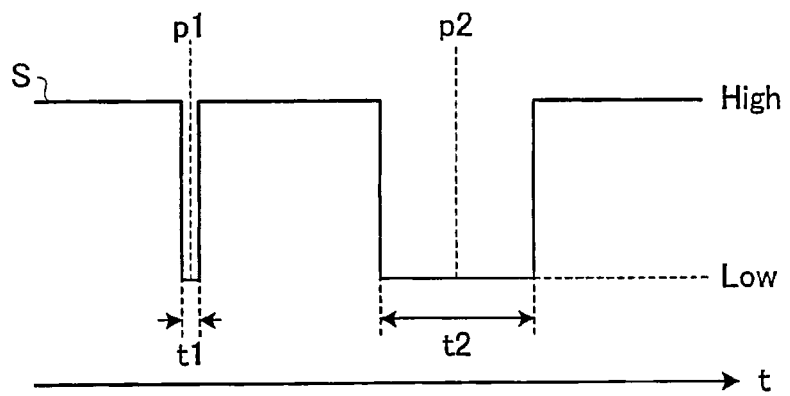
FIG. 5B is a view illustrating the mapping process.
Figure 5C:
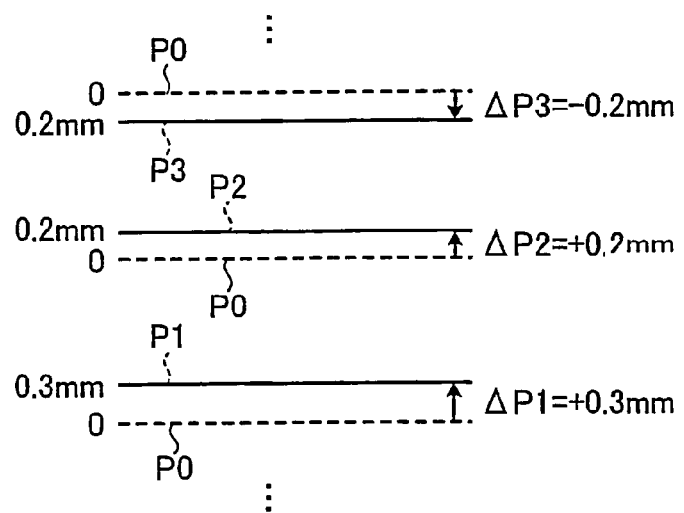
FIG. 5C is a view illustrating the mapping process.

Using the results detected by substrate detector device 23, computation component 611 performs a mapping process to calculate the position of each wafer (W), the thickness of each wafer (W), the pitch between wafers (W) and the like. Descriptions of such a mapping process are provided with reference to FIG. 5A~5C. FIG. 5A~5C are views illustrating the mapping process.

As shown in FIGS. 5A and 5B, computation component 611 calculates the thickness of a wafer (W) in a vertical direction based on the time during which substrate detector device 23 detected the wafer (W) (see (t1) and (t2) in FIG. 5B) and the speed of substrate detector device 23 moving in the vertical direction. Also, by setting the center of the thickness (see (p1) and (p2) in FIG. 5B) as the position of a wafer (W), computation component 611 calculates the pitch between wafers (W) from the calculated positions of each wafer (W). It is noted that the point to be calculated for the position of a wafer (W) is not limited to the center of its thickness, and any other point may be employed.

Computation component 611 calculates the shifted amount between the calculated position of a wafer (W) and the predetermined base point for each wafer (W). Such a process is described with reference to FIG. 5C.

Point (P0) shown in FIG. 5C is a base point predetermined for each slot of cassette (C1). Points (P1~P3) are positions of wafers (W) respectively calculated by computation component 611 according to the results detected by substrate detector device 23.

For example, when points (P1~P3) are shifted respectively from the base point by 0.3 mm upward, 0.2 mm upward, and 0.2 mm downward, the computation component 611 calculates the shifted amounts ΔP1~ΔP3 between points (P1~P3) and base point (P0) respectively. In such a case, by setting a shifted amount to be positive when a wafer (W) is shifted upward, each shifted amount is calculated as ΔP1=+0.3 mm, ΔP2=+0.2 mm and ΔP3=−0.2 mm.

In the above example, the shifted amount is set positive when a wafer (W) is shifted upward from base point (P0). However, the shifted amount may also be set positive when a wafer is shifted downward from base point (P0). Also, the information about the base point (P0) corresponding to each slot is stored in advance in memory 62, for example.

Computation component 611 sends to memory 62 calculation results, namely, mapping information 621 including the position of each wafer (W), the thickness of each wafer (W), the pitch between wafers (W) and the shifted amount of each wafer (W) from the base point.

Figure 6A:
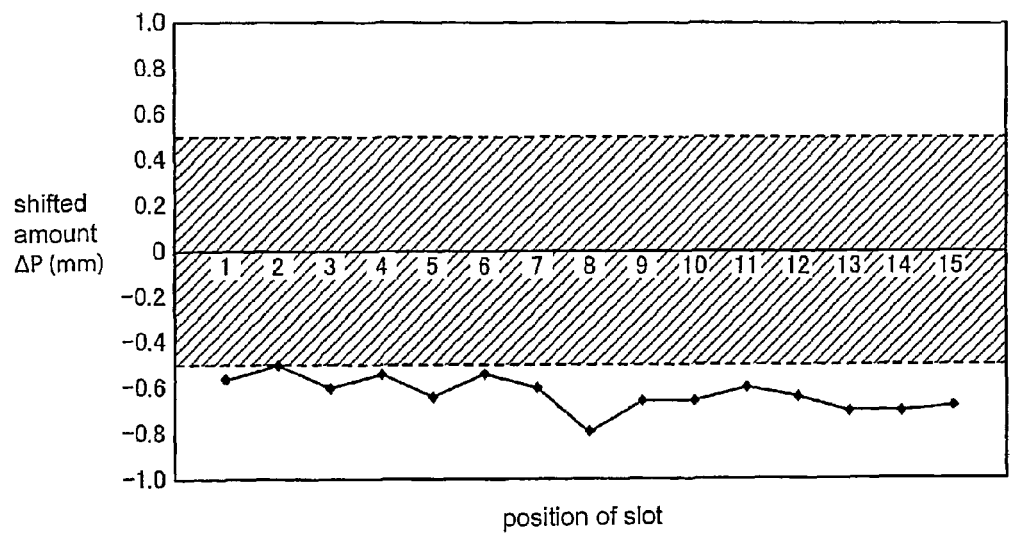
FIG. 6A is a view showing an example of a conventional verification process.

Verification component 612 performs a verification process based on mapping information 621 stored in memory 62. The contents of the verification process conducted by verification component 612 according to the first embodiment are now described in comparison with the verification process performed in a conventional substrate processing apparatus. FIG. 6A is a view showing an example of a conventional verification process, and FIG. 6B is a view showing an example of the verification process according to the first embodiment.

Figure 6B:
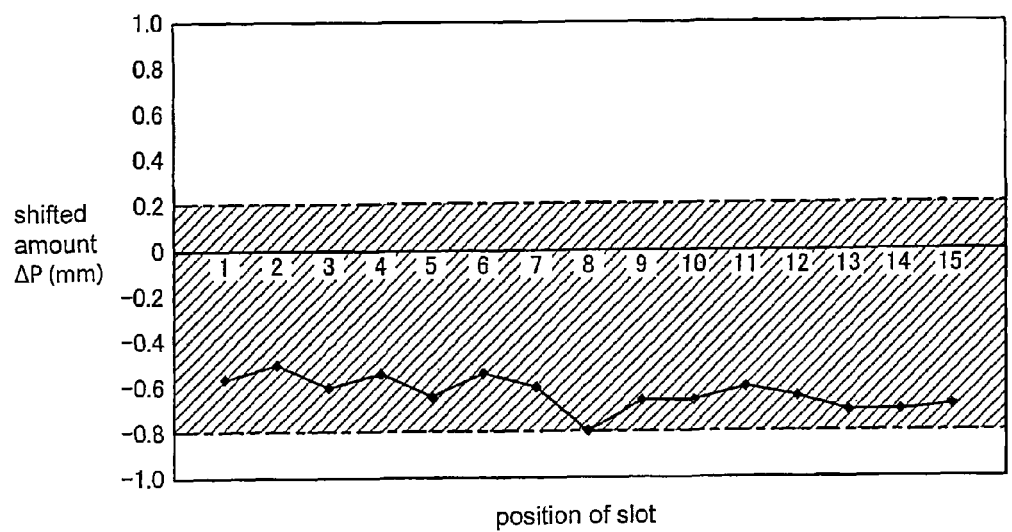
FIG. 6B is a view showing an example of a verification process according to the first embodiment.

FIGS. 6A and 6B each show shifted amounts ΔP measured from the base point set for wafers (W) accommodated in slots. Slot positions are plotted on the horizontal axis of the graphs in FIGS. 6A and 6B and shifted amounts ΔP are plotted on the vertical axis.

As shown in FIG. 6A, in a conventional substrate processing apparatus, a predetermined range with the central value of ΔP=0 is set (here, ±0.5 mm), and if shifted amounts ΔP of the wafers (W) are all within the set range, the substrate transfer device is allowed to conduct a process of unloading the wafers from the cassette. On the other hand, if any one of the shifted amounts ΔP is found to be beyond the predetermined range, the subsequent unloading process is canceled because of an abnormal position.

As described above, using a conventional substrate processing apparatus, when an abnormality is found, since the process of unloading from the cassette is canceled, throughput may likely be lowered.

By contrast, verification component 612 of the first embodiment verifies whether the difference between the maximum and minimum values among shifted amounts ΔP of wafers (W) is equal to or less the threshold value.

For example, in an example shown in FIG. 6B, among shifted amounts ΔP, the maximum value is "−0.5 mm," which is the shifted amount of a wafer (W) in slot 2, and the minimum value is "−0.8 mm," which is the shifted amount of a wafer (W) in slot 8. The verification component 612 verifies whether the difference "0.3 mm" between those maximum and minimum values is equal to or less the threshold value (1.0 mm in this example). Then, since the difference between the maximum and minimum values "0.3 mm" is below the threshold value (1.0 mm), verification component 612 determines verification results to be "OK." In such a case, the substrate unloading process is not canceled, and thus throughput is not lowered.

Meanwhile, when the difference between the maximum and minimum values among shifted amounts ΔP exceeds the threshold value (1.0 mm), verification component 612 instructs later-described correction component 613 and transfer control component 614 to cancel subsequent processes.

As described above, using verification component 612 of the first embodiment, even if positions of wafers (W) are detected as being rather higher or lower as a whole, the subsequent substrate unloading process will not be canceled. Thus, throughput is improved compared with using a conventional substrate processing apparatus.

Description is provided by referring again to FIG. 4. Based on mapping information 621, correction component 613 corrects the unloading target position of each wafer (W) indicated by unloading target position information 622. In particular, correction component 613 shifts the unloading target position of each wafer (W) by a shifted amount ΔP which has the greatest absolute value among the shifted amounts ΔP of the wafers (W) included in mapping information 621.

For instance, in the example shown in FIG. 6B, among the shifted amounts ΔP of wafers (W), the shifted amount of slot 8 "−0.8 mm" has the greatest absolute value (absolute value of 0.8). In such an example, correction component 613 corrects the unloading target position of each wafer (W) by shifting 0.8 mm downward. Then, correction component 613 sends the corrected unloading target position to transfer control component 614.

When correction component 613 is instructed by verification component 612 to cancel the process, correction component 613 does not conduct the correction process.

Transfer control component 614 controls substrate transfer device 21 to perform the process for transferring wafers (W) between cassettes (C1~C4) and the buffer cassette on substrate delivery stage 22. When substrate processing apparatus 100 is operating a substrate unloading process, transfer control component 614 controls substrate transfer device 21 to unload wafers (W) from a cassette (C1, C2, C3 or C4) and accommodates the unloaded wafers in the buffer cassette.

At that time, transfer control component 614 controls substrate transfer device 21 to unload wafers (W) from a cassette (C1, C2, C3 or C4) based on the unloading target positions corrected by the correction component 613. Specifically, transfer control component 614 moves the transfer arm of substrate transfer device 21 vertically so that positions of multiple holder portions (211a, 212a~212d) provided in substrate transfer device 21 correspond to the corrected unloading target positions. Next, holder portions (211a, 212a~212d) are instructed by transfer control component 614 to insert themselves into a cassette (C1, C2, C3 or C4) so that wafers (W) are held by holder portions (211a, 212a~212d), and then to retract from the cassette. Thereby, multiple (five, in this example) wafers (W) are unloaded from a cassette (C1, C2, C3 or C4) all at once.

Meanwhile, when transfer control component 614 is instructed to cancel the unloading process by verification component 612, namely, when verification component 612 verifies that the difference between the maximum and minimum values among the shifted amounts ΔP exceeds the threshold value (1.00 mm), substrate transfer device 21 does not unload wafers (W).

Next, in substrate processing apparatus 100, substrate transfer device 31 unloads a wafer (W) accommodated in the buffer cassette and loads it into a substrate processing component 5. Then, when the treatment of wafer (W) by the substrate processing component 5 is completed, substrate transfer device 31 unloads the treated wafer (W) from the substrate processing component 5 and returns it to the buffer cassette.

In substrate processing apparatus 100, following the command from controller 61, substrate transfer device 21 unloads the treated wafer (W) from the buffer cassette and accommodates it in the cassette (C1, C2, C3 or C4).

For example, controller 61 stores the corrected unloading target position in memory 62 at the time of the substrate unloading process (not shown in FIG. 4), and accommodates the treated wafer (W) into the original slot of the original cassette (C1, C2, C3 or C4) based on the corrected unloading target position stored in the memory.

More specifically, transfer control component 614 controls holder portions (211a, 212a~212d) to hold treated wafers (W) and to move the transfer arm of substrate transfer device 21 vertically so that the positions of holder portions (211a, 212a~212d) correspond to the corrected unloading target positions. Then, transfer control component 614 controls holder portions (211a, 212a~212d) to be inserted into a cassette (C1, C2, C3 or C4) so that wafers (W) held by holder portions (211a, 212a~212d) are accommodated in the cassette (C1, C2, C3 or C4). After that, holder portions (211a, 212a~212d) retract. Accordingly, multiple wafers (five, in this example) are accommodated in the cassette (C1, C2, C3 or C4) all at once.

Figure 7:
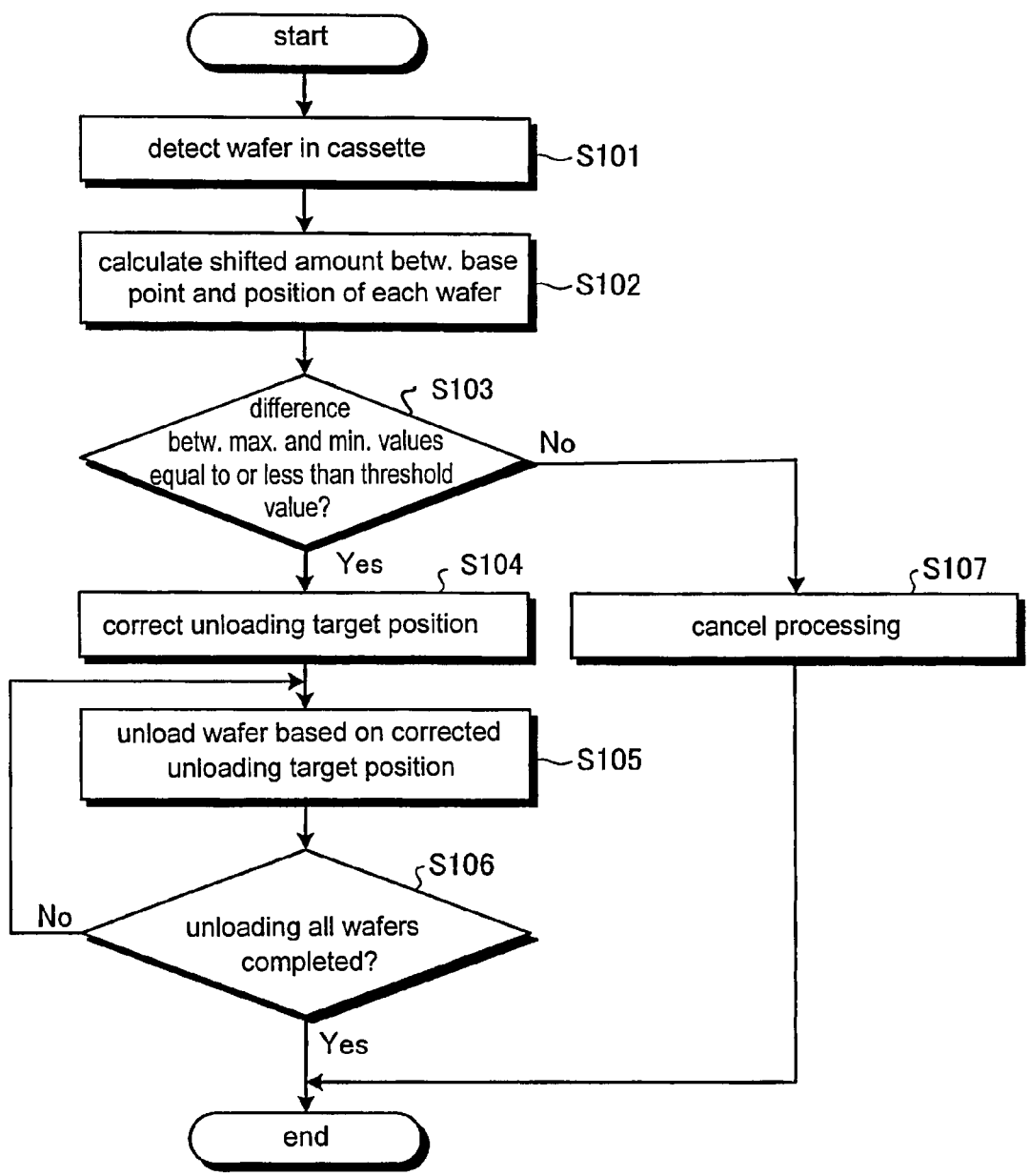
FIG. 7 is a flowchart showing the steps for unloading a substrate performed by the substrate processing apparatus according to the first embodiment.

The above substrate unloading process is described in detail with reference to FIG. 7. FIG. 7 is a flowchart showing procedures of a substrate unloading process conducted by a substrate processing apparatus 100 according to the first embodiment.

As shown in FIG. 7, in substrate processing apparatus 100, first, substrate detector device 23 detects wafers (W) accommodated in a cassette (C1, C2, C3 or C4) (step S101). Next, computation component 611 calculates the shifted amount ΔP between the position of each wafer (W) and the base point (step S102). It is noted that computation component 611 also calculates the position of a wafer (W), the thickness of a wafer (W) and the pitch of wafers (W) and the like in addition to the shifted amount ΔP.

Next, verification component 612 verifies whether the difference between the maximum and minimum values of shifted amounts ΔP is equal to or less the threshold value (step S103). If the difference between the maximum and minimum values of shifted amounts ΔP is verified to be equal to or less the threshold value, (Yes, in step S103), correction component 613 corrects the predetermined unloading target positions (step S104). More specifically, correction component 613 shifts the unloading target position of each wafer (W) by the shifted amount ΔP with the greatest absolute value among shifted amounts ΔP of the wafers (W).

Next, transfer control component 614 controls substrate transfer device 21 to unload wafers (W) from a cassette (C1) based on the unloading target positions corrected by correction component 613 (step S105). The wafers (W) unloaded from a cassette (C1) are accommodated in the buffer cassette by substrate transfer device 21.

Then, controller 61 determines whether the unloading process for all wafers (W) is completed (step S106). If the unloading process is not completed yet (No, in step S106), the process in step (S105) is repeated on a wafer that is not unloaded yet. After that, when controller 61 determines that the unloading process for all the wafers is completed (Yes, in step S106), the controller 61 finishes the substrate unloading process.

In step (S103), when it is verified that the difference between the maximum and minimum values of shifted amounts ΔP exceeds the threshold value (No, in step S103), verification component 612 instructs correction component 613 and transfer control component 614 to cancel their processes (step S107), and the controller 61 finishes the substrate unloading process.

As described so far, substrate processing apparatus 100 of the first embodiment includes substrate transfer device 21, substrate processing component 5 and substrate delivery stage 22 (corresponds to delivery section). The substrate transfer device loads wafers (W) from outside. Substrate processing component 5 treats the wafer (W) loaded by the substrate transfer device. Substrate delivery stage 22 is the delivery section that delivers a wafer (W) loaded by the substrate transfer device to a substrate processing component 5.

Substrate processing apparatus 100 of the first embodiment includes substrate transfer device 21, substrate detector device 23 and control device 6. Substrate transfer device 21 transfers a wafer (W) in a cassette (C1, C2, C3 or C4) capable of accommodating multiple wafers (W). Substrate detector device 23 detects wafers (W) accommodated in a cassette (C1, C2, C3 or C4). Control device 6 controls substrate transfer device 21. Also, control device 6 is provided with computation component 611, verification component 612 and transfer control component 614. Computation component 611 calculates the shifted amount ΔP for each wafer between the predetermined base point and the position of a wafer (W) detected by substrate detector device 23 by setting a position as positive when the position is shifted upward or downward from the base point. Verification component 612 verifies whether the difference between the maximum and minimum values among the shifted amounts ΔP calculated by computation component 611 is equal to or less the threshold value. When verification component 612 verifies that the difference between the maximum and minimum values is equal to or less the threshold value, transfer control component 614 controls substrate transfer device 21 to unload wafers (W) from a cassette (C1, C2, C3 or C4).

Compared with a conventional substrate processing apparatus, fewer wafers (W) are determined to be in abnormal positions and thus cancelation of subsequent procedures is less likely using substrate processing apparatus 100 of the first embodiment. As a result, throughput is improved.

Second Embodiment

In the example described in the first embodiment above, a verification process by verification component 612 was conducted at the same time on all the wafers (W) accommodated in a cassette (C1, C2, C3 or C4). However, that is not the only option. A verification process may be divided into multiple verification processing groups.

Figure 8A:
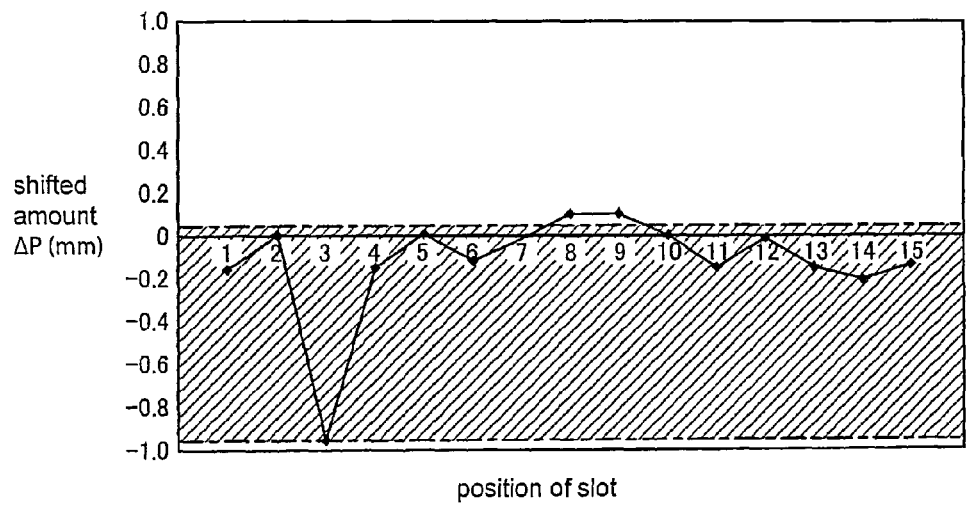
FIG. 8A is a view showing an example of the verification process according to the first embodiment.
Figure 8B:
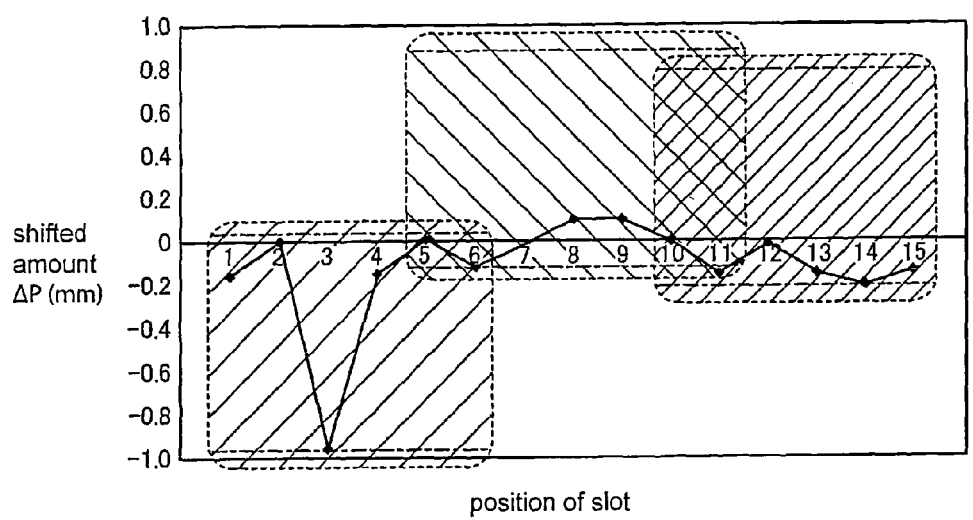
FIG. 8B is a view showing an example of the verification process according to a second embodiment.

In the following example, a verification process is conducted by dividing the wafers into multiple verification groups. FIG. 8A is a graph showing an example of a verification process according to the first embodiment, and FIG. 8B is a graph showing an example of a verification process according to a second embodiment.

The verification process according to the first embodiment was conducted at the same time on all the wafers (W) (15 wafers (W) in the example) accommodated in a cassette (C1). Namely, in the first embodiment, verification component 612 verifies that the difference between the maximum and minimum values among the shifted amounts ΔP of all 15 wafers (W) is equal to or less the threshold value. When the difference is beyond the threshold value, the verification result is determined to be "FAIL."

For instance, in the example shown in FIG. 8A, the shifted amount ΔP=−0.95 mm of the wafer (W) in slot 3 is the minimum value among all the wafers (W), and the shifted amount ΔP=+0.1 mm of the wafers (W) in slots 8 and 9 is the maximum value among all the wafers (W). In this case, since the difference between the maximum and minimum values "1.05 mm" is beyond the threshold value "1.0 mm", verification component 612 determines the verification result to be FAIL, and subsequent substrate unloading processes are canceled.

Meanwhile, in substrate processing apparatus 100, substrate transfer device 21 is provided with five holder portions (211a, 212a~212d), and maximum five wafers (W) can be unloaded at one time from a cassette (C1, C2, C3 or C4) using five holder portions (211a, 212a~212d).

In the second embodiment, a verification process is conducted by dividing wafers (W) into a certain number of verification groups based on the number of holder portions (211a, 212a~212d) provided in substrate transfer device 21.

More specifically, verification component 612 conducts a verification process on seven slots in one group, namely, five slots into which holder portions (211a, 212a~212d) are inserted and two more slots vertically adjacent to those slots. However, when the lowermost slot (slot 1) or uppermost slot (slot 15) is included, a verification process is conducted on six slots in one group, namely, five slots into which holder portions (211a, 212a~212d) are inserted and an upper or lower slot vertically adjacent to those slots. When the lowermost slot (slot 1) or uppermost slot (slot 15) is included, and when the number of remaining slots is smaller than five, a verification procedure may be conducted on those remaining slots as one group.

As shown in FIG. 8B, for example, verification component 612 conducts a verification process on six wafers (W) in slots 1 through 6. In this verification group, the maximum value among the shifted amounts is ΔP=0 mm, which is the shifted amount of wafers (W) in slot 2 and slot 4, and the minimum value is ΔP=−0.95 mm, which is the shifted amount of a wafer (W) in slot 3. Since the difference between the maximum and minimum values is 0.95 mm and is smaller than the threshold value (1.0 mm), verification component 612 determines verification results to be OK in slots 1~5, into which holder portions (211a, 212a~212d) are inserted.

Verification component 612 conducts another verification process on seven wafers (W) in slots 5 through 11. In this verification group, the maximum value among the shifted amounts is ΔP=0.1 mm, which is the shifted amount of wafers (W) in slot 8 and slot 9, and the minimum value is ΔP=−0.1 mm, which is the shifted amount of a wafer (W) in slot 6. Since the difference between the maximum and minimum values is 0.2 mm and is smaller than the threshold value (1.0 mm), verification component 612 determines verification results to be OK in slots 6~10, into which holder portions (211a, 212a~212d) are inserted.

Verification component 612 conducts yet another verification procedure on six wafers (W) in slots 10 through 15. In this verification group, the maximum value among the shifted amounts is ΔP=0 mm, which is the shifted amount of a wafer (W) in slot 10, and the minimum value is ΔP=−0.2 mm, which is the shifted amount of a wafer (W) in slot 14. Since the difference between the maximum and minimum values is 0.2 mm and is smaller than the threshold value (1.0 mm), verification component 612 determines verification results to be OK in slots 11~15, into which holder portions (211a, 212a~212d) are inserted.

As described above, by dividing wafers (W) into a certain number of verification groups based on the number of holder portions (211a, 212a~212d) provided in substrate transfer device 21, even if the verification result on wafers (W) is determined to be FAIL when all the wafers are verified in one process according to the first embodiment, such wafers (W) can be determined to be OK using the verification process according to the second embodiment, thereby, throughput is even further improved.

Verification component 612 is set to conduct a verification process not only on wafers (W) in five slots to be unloaded, but also on wafer(s) in one or two slots adjacent to those five slots. More specifically, verification component 612 conducts a verification process on each wafer group to be unloaded by holder portions (211a, 212a~212d) along with a wafer accommodated in an upper and/or lower slot adjacent to the wafer group. Accordingly, in verification procedures successively conducted on wafer groups adjacent to each other, wafers (W) other than those to be unloaded by holder portions (211a, 212a~212d) overlap each other.

That is because when a wafer (W) is unloaded from each slot, namely, after holder portions (211a, 212a~212d) were inserted in lower slots from which wafers (W) are unloaded, and when holder portions (211a, 212a~212d) are moved to upper slots from which wafers (W) are unloaded, holder portions (211a, 212a~212d) may interfere with a wafer (W) in an upper or lower slot positioned adjacent to the slots from which wafers (W) are unloaded.

As described above, when a verification process is conducted by adding one or two slots adjacent to the slots from which wafers (W) are unloaded, verification accuracy is enhanced.

In the second embodiment, correction component 613 conducts a correction process for each of the above verification groups. For example, in the example shown in FIG. 8B, for wafers (W) in slots 1~5, the unloading target positions of the wafers (W) in slots 1~5 are corrected by applying a correction amount of ΔP=−0.95 mm, which is the shifted amount with the greatest absolute value. Also, for wafers (W) in slots 6~10, correction component 613 corrects the unloading target positions of wafers (W) in slots 6~10 by applying a correction amount of ΔP=0.1 mm, which is the shifted amount with the greatest absolute value. Furthermore, for wafers (W) in slots 11~15, correction component 613 corrects the unloading target positions of wafers (W) in slots 11~15 by applying a correction amount of ΔP=−0.2 mm, which is the shifted amount with the greatest absolute value.

As described above, the wafers (W) are divided into a certain number of verification groups based on the number of holder portions (211a, 212a~212d) provided in substrate transfer device 21, and a correction process is conducted for each group. Thereby, the unloading target positions are more accurately corrected.

Figure 9:
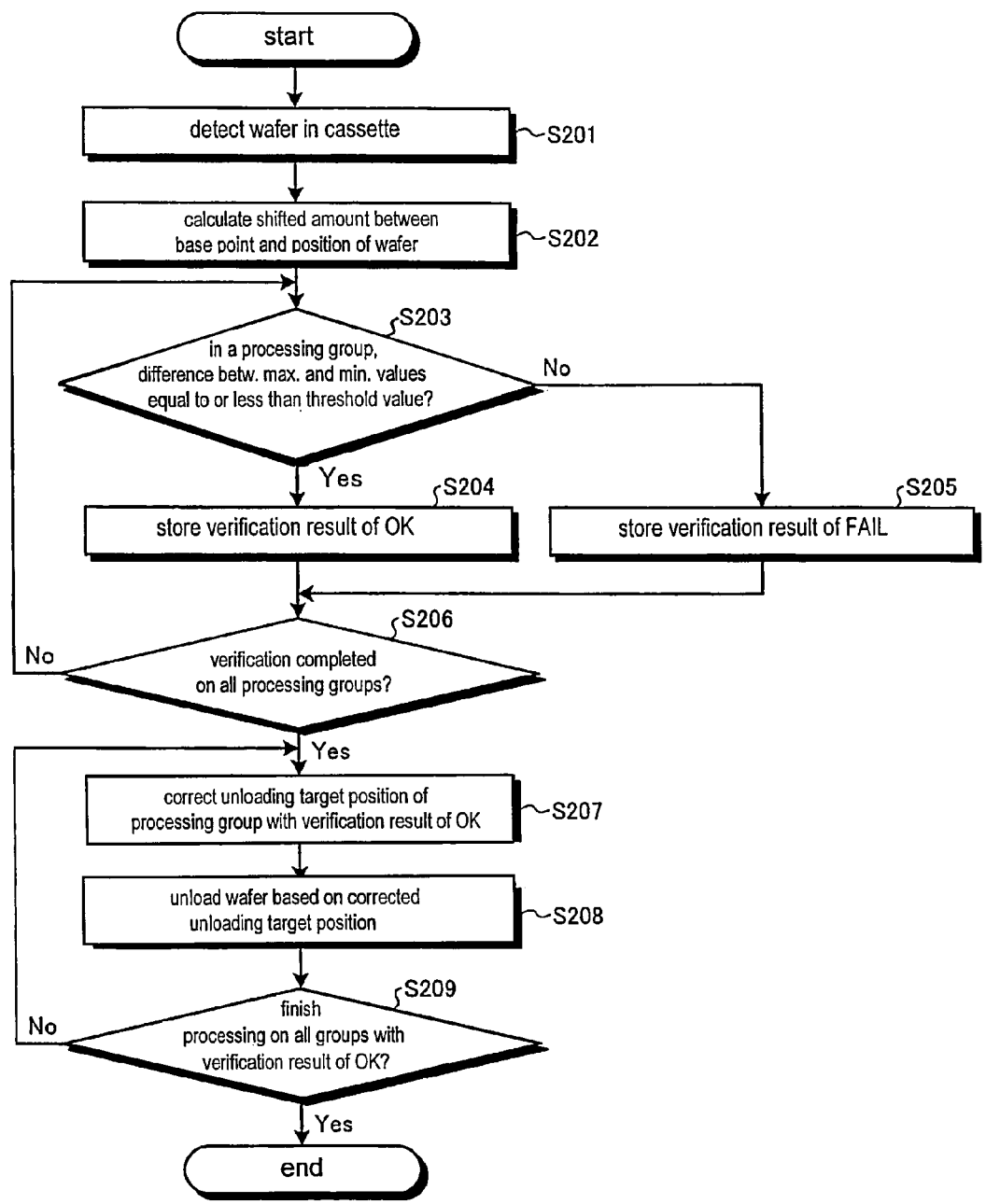
FIG. 9 is a flowchart showing the steps for unloading a substrate performed by the substrate processing apparatus according to the second embodiment.

The substrate unloading process according to the second embodiment is described with reference to FIG. 9. FIG. 9 is a flowchart showing the substrate unloading process performed by the substrate processing apparatus according to the second embodiment.

As shown in FIG. 9, in substrate processing apparatus 100 according to the second embodiment, first, substrate detector device 23 detects wafers (W) accommodated in a cassette (C1, C2, C3 or C4) (step S201). Next, computation component 611 calculates the shifted amount ΔP between the base point and the position of each wafer (W) (step S202).

Next, for a verification group, verification component 612 verifies whether the difference between the maximum and minimum values among the shifted amounts ΔP is equal to or less the threshold value (step S203). Then, when the difference between the maximum and minimum values of shifted amounts ΔP is verified to be equal to or less the threshold value (Yes, in step S203), memory 62 stores the information that the verification result for the wafers (W) in the verification group is OK (step S204). On the other hand, if the difference between the maximum and minimum values of shifted amounts ΔP is verified to be beyond the threshold value (No, in step S203), memory 62 stores the information that the verification result for the wafers (W) in the verification group is FAIL (step S205).

Next, verification component 612 determines whether all the verification groups are verified or not (step S206), and if there is a verification group left unchecked (No, in step S206), processes in steps (S203)~(S205) are conducted on the unchecked verification group.

In step (S206), when verification on all the verification groups is determined to be completed (Yes, in step S206), correction component 613 corrects the predetermined unloading positions for a verification group with a verification result of OK (step S207). More specifically, for wafers (W) included in the verification group with a verification result of OK, correction component 613 shifts their unloading target positions by the shifted amount ΔP that has the greatest absolute value among the shifted amounts ΔP of those wafers (W).

Next, for a verification group with a verification result of OK, transfer control component 614 controls substrate transfer device 21 to unload wafers (W) from a cassette (C1, C2, C3 or C4) based on the corrected unloading target positions corrected by correction component 613 (step S208). Wafers (W) unloaded from a cassette (C1, C2, C3 or C4) will be accommodated in the buffer cassette by substrate transfer device 21.

Then, controller 61 determines whether or not wafers (W) in all the verification groups with a verification result of OK have all been unloaded (step (S209), and if the unloading process has not yet been completed (No, in step S209), processes in steps (S207)~(S208) are conducted on the verification group for which unloading is not completed. Then, when it is determined that the unloading process for wafers (W) in all the verification groups has been completed (Yes, in step S209), controller 61 finishes the substrate unloading process.

As described so far, in the second embodiment, by dividing the wafers into a certain number of verification groups based on the number of holder portions (211a, 212a~212d) provided with substrate transfer device 21, verification component 612 conducts a verification process for each verification group. Thereby, throughput is improved even more than in the first embodiment.

In the second embodiment, the verification result of a verification group may be determined to be FAIL by verification component 612. In such a case, wafers (W) in the verification group determined to be FAIL will not be unloaded from a cassette (C1, C2, C3 or C4), while substrate transfer device 21 is controlled to unload the wafers (W), which are in the verification group determined to be OK by verification component 612, from the cassette (C1, C2, C3 or C4).

Accordingly, except for the wafers in a verification group that was determined to be FAIL, the wafers (W) included in other verification groups are safely unloaded from a cassette (C1, C2, C3 or C4), thereby improving throughput even further, compared with conventional technology.

However, the example above is not the only option. When one of the verification groups is determined to have a verification result of FAIL, an unloading process may also be canceled for all the wafers in other groups.

In the example shown in the second embodiment, the wafers are divided into a certain number of verification groups based on the number of holder portions (211a, 212a~212d). However, that is not the only option, and the number of wafers to be divided for verification groups may be determined freely.

Third Embodiment

In each example of the above embodiment, verification component 612 verifies whether the difference between the maximum and minimum values among all the shifted amounts ΔP of the wafers (W) is equal to or less the threshold value. In a third embodiment, verification component 612 conducts further verification to see whether gaps between wafers (W) and holder portions (211a, 212a~212d) are each sufficiently secured so as not to cause interference between wafers (W) and holder portions (211a, 212a~212d) when holder portions (211a, 212a~212d) are inserted into the corrected unloading target positions.

Figure 10:
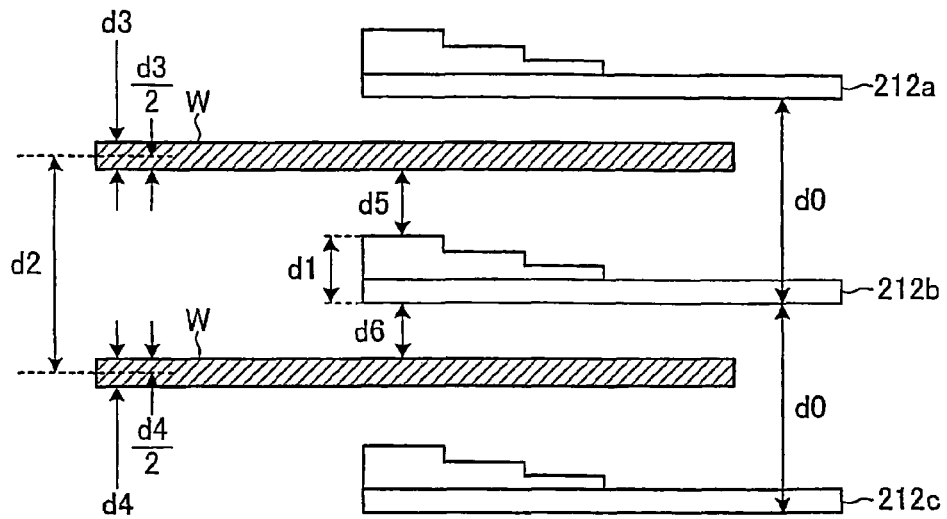
FIG. 10 is a view illustrating the contents included in mapping information.

Such a verification process is described below with reference to FIGS. 10 and 11. FIG. 10 is a diagram illustrating the contents included in mapping information 621. Also, FIG. 11 is a diagram illustrating the verification process by verification component 612 according to the third embodiment.

As shown in FIG. 10, in addition to the position of each wafer (W), the mapping information 21 includes a pitch (d2) between wafers (W), thicknesses (d3, d4), a distance (d5) between the upper surface of a holder portion (211a, 212a, 212b, 212c or 212d) and the lower surface of a wafer (W), and a distance (d6) between the lower surface of a holder portion (211a, 212a, 212b, 212c or 212d) and the lower surface of a wafer (W). It is noted that a pitch (d0) between holder portions (211a, 212a~212d) and a thickness (d1) of holder portions (211a, 212a~212d) are known information. The distance (d5) is also known information preset for the distance between a wafer (W) and a holder portion (211a, 212a, 212b, 212c or 212d) by considering warping of a wafer (W) to avoid touching between a wafer (W) and a holder portion.

Pitch (d2) between wafers (W) is calculated from the positions of wafers (W). Also, a distance (d6) between a holder portion (211a, 212a, 212b, 212c or 212d) and a wafer (W) is calculated from a pitch (d2), distance (d5) and thicknesses (d1, d3, d4). More specifically, since a pitch (d2) between wafers (W) is obtained by calculating (d2=d3/2+d4/2+d1+d5+d6), a distance (d6) is obtained by calculating (d6=d2−d3/2−d4/2−d1−d5).

Figure 11:
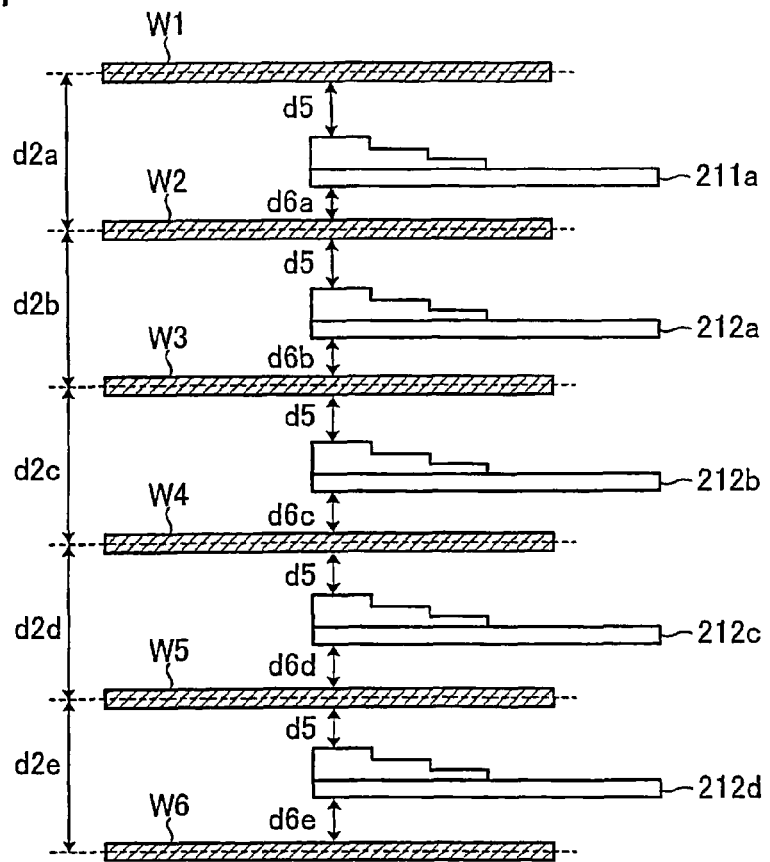
FIG. 11 is a view illustrating a verification process performed by a verification component according to a third embodiment.

In the example shown in FIG. 11, wafers (W1~W5) are unloaded using holder portions (211a, 212a~212d). Pitches between wafers (W1~W5) are (d2a~d2d) respectively. Also, the pitch is (d2e) between wafer (W5) and wafer (W6) positioned adjacent below wafer (W5). Distances between the lower surfaces of holder portions (211a, 212a~212d) and the upper surfaces of wafers (W2~W6) are (d6a~d6e) respectively.

Verification component 612 verifies whether pitches (d2a~d2e) between wafers (W1~W6) respectively are equal to or greater than the threshold value. If any one of the pitches (d2a~d2e) between respective wafers (W1~W6) is below the threshold value, namely, if the distance between wafers (W) is narrow and interference may likely occur between a wafer (W) and a holder portion (211a, 212a, 212b, 212c or 212d) when the holder portion is inserted, verification component 612 determines the verification to be FAIL and cancels the subsequent wafer unloading process.

Verification component 612 verifies whether distances (d6a~d6e) are equal to or greater than the threshold value between lower surfaces of holder portions (211a, 212a~212d) and upper surfaces of wafers (W2~W6) respectively.

When any one of distances (d6a~d6e) is below the threshold value, verification component 612 determines verification to be FAIL and cancels the subsequent wafer unloading process. On the other hand, when verification component 612 determines distances between upper surfaces of holder portions (211a, 212a~212d) and lower surfaces of wafers (W) are each equal to or greater than a first distance, and distances between lower surfaces of holder portions (211a, 212a~212d) and upper surfaces of wafers (W) are each equal to or greater than a second distance, then, transfer control component 614 controls substrate transfer device 21 to unload wafers (W) from a cassette (C1, C2, C3 or C4).

It is noted that the threshold value for distances between lower surfaces of holder portions (211a, 212a~212d) and upper surfaces of wafers (W) is set greater than distances (d5) between upper surfaces of holder portions (211a, 212a~212d) and lower surfaces of wafers (W). That is because interference between holder portions (211a, 212a~212d) and wafers (W) tends to occur between the lower surface of a holder portion and the upper surface of a wafer, since wafers (W) tend to incline toward the front of a cassette (the opening side of a cassette (C1, C2, C3 or C4)) when they are accommodated in the cassette, and tips of holder portions (211a, 212a~212d) tend to incline downward due to their own weight.

By setting the second distance greater than the first distance, verification accuracy is improved, and interference between a holder portion (211a, 212a, 212b, 212c or 212d) and a wafer (W) is even more securely prevented.

As described so far, in the third embodiment, based on the pitch between wafers (W), the pitches among multiple holder portions (211a, 212a~212d), and the thicknesses of holder portions (211a, 212a~212d) respectively calculated by computation component 611, verification component 612 verifies that distances between upper surfaces of holder portions (211a, 212a~212d) and lower surfaces of wafers (W) are each equal to or greater than a first distance, and also verifies that distances between lower surfaces of holder portions (211a, 212a~212d) and upper surfaces of wafers (W) are each equal to or greater than a second distance.

When the verification component 612 verifies that distances between upper surfaces of holder portions (211a, 212a~212d) and lower surfaces of wafers (W) are each equal to or greater than a first distance, and that distances between lower surfaces of holder portions (211a, 212a~212d) and upper surfaces of wafers (W) are each equal to or greater than a second distance, transfer control component 614 controls substrate transfer device 21 to unload wafers (W) from a cassette (C1, C2, C3 or C4). Accordingly, interference between a holder portion (211a, 212a, 212b, 212c or 212d) and a wafer (W) is even more securely prevented.

A substrate processing apparatus according to an embodiment of the present invention is employed in various types of substrate processing apparatuses for conducting treatments such as cleaning, resist application, CVD (chemical vapor deposition) and the like on substrates such as semiconductor substrates, liquid-crystal substrates, CD substrates, glass substrates and the like.

If an unloading process of substrates from a cassette is canceled each time a substrate processing apparatus has determined an abnormality exists, throughput may likely be lowered.

Throughput is improved by using the substrate transfer apparatus according to an embodiment of the present invention and the substrate processing apparatus according to an embodiment of the present invention, and by employing the substrate unloading method according to an embodiment of the present invention and a memory medium according to an embodiment of the present invention.

A substrate transfer apparatus according to an embodiment of the present invention includes a substrate transfer device, substrate detector device and a control device. The substrate transfer device transfers substrates between itself and cassettes capable of accommodating multiple substrates. The substrate detector device detects the substrates accommodated in a cassette. The control device controls the substrate transfer device. The control device is provided with a computation component, a verification component and a transfer control component. The computation component calculates the shifted amount between a preset base point and the position of a wafer detected by the substrate detector device by setting the amount as positive when a wafer is shifted upward or downward from the base point. The verification component verifies whether the difference between the maximum and minimum values among the shifted amounts calculated by the computation component is equal to or less the threshold value. When the difference between the maximum and minimum values is verified to be equal to or less the threshold value by the verification component, the transfer control component controls the substrate transfer device to unload substrates from the cassette.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate transfer apparatus, comprising:
a substrate transfer device configured to load and unload a plurality of substrates into and from a cassette configured to accommodate the plurality of substrates;
a substrate detector device configured to detect positions of the substrates accommodated in the cassette; and
a control device configured to control the substrate transfer device,
wherein the control device includes a computation component configured to calculate a shifted amount between a base position and the position of each of the substrates detected by the substrate detector device such that the shifted amount of an upward or downward shift from the base position is set as a positive value, a verification component configured to verify whether a difference between maximum and minimum values among the shifted amounts calculated by the computation component is equal to or less than a threshold value, and a transfer control component configured to control the substrate transfer device such that the substrate transfer device unloads the substrates from the cassette when the verification component verifies that the difference between the maximum and minimum values is equal to or less than the threshold value.

2. The substrate transfer apparatus according to claim 1, wherein the control device has a correction component configured to correct an unloading target position in accordance with the shifted amount having a greatest absolute value, and the transfer control component is configured to control the substrate transfer device to unload the substrates from the cassette based on the unloading target position corrected by the correction component.

3. The substrate transfer apparatus according to claim 1, wherein the verification component is configured to conduct a verification process which is divided into a plurality of verification processing groups.

4. The substrate transfer apparatus according to claim 3, wherein the substrate transfer device has a plurality of holder portions configured to hold the plurality of substrates, and the verification component is configured to conduct the verification process such that the verification process is divided into the verification processing groups each having a number of substrates corresponding to a number of the holder portions.

5. The substrate transfer apparatus according to claim 4, wherein the verification component is configured to conduct the verification process such that the verification process is divided into the verification processing groups each having a group of the substrates corresponding to the holder portions and at least one of an adjacent substrate above and an adjacent substrate below the group of substrates.

6. The substrate transfer apparatus according to claim 3, wherein the verification component is configured to conduct the verification process such that the verification process is divided into the verification processing groups having adjacent portions of the processing groups overlapping each other.

7. The substrate transfer apparatus according to claim 3, wherein the transfer control component is configured to control the substrate transfer device such that the substrate transfer device does not unload a group of substrates in a verification processing group from the cassette when the verification processing group has a difference between maximum and minimum values verified to exceed the threshold value and that the substrate transfer device unloads a group of substrates in a verification processing group from the cassette when the verification processing group has a difference between maximum and minimum values verified to be equal to or less than the threshold value.

8. The substrate transfer apparatus according to claim 4, wherein the plurality of holder portions is positioned such that the holder portions are aligned along a lamination direction of the substrates at a pitch, the computation component is configured to calculate pitches between the substrates, the verification component is configured to verify whether spaces between lower surfaces of the holder portions and upper surfaces of the substrates are equal to or greater than a distance threshold value based on the pitches between the substrates calculated by the computation component, the pitch between the holder portions and thicknesses of the holder portions, and the transfer control component is configured to control the substrate transfer device such that the substrate transfer device unload the substrates from the cassette when the spaces between the lower surfaces of the holder portions and the upper surfaces of the substrates are equal to or greater than the distance threshold value set based on the pitches between the substrates, the pitch between the holder portions and the thicknesses of the holder portions.

9. The substrate transfer apparatus according to claim 8, wherein the distance threshold value set based on the pitches between the substrates, the pitch between the holder portions and the thicknesses of the holder portions is set greater than spaces between upper surfaces of the holder portions and lower surfaces of the substrates.

10. The substrate transfer apparatus according to claim 2, wherein the verification component is configured to conduct a verification process which is divided into a plurality of verification processing groups.

11. The substrate transfer apparatus according to claim 10, wherein the substrate transfer device has a plurality of holder portions configured to hold the plurality of substrates, and the verification component is configured to conduct the verification process such that the verification process is divided into the verification processing groups each having a number of substrates corresponding to a number of the holder portions.

12. The substrate transfer apparatus according to claim 11, wherein the verification component is configured to conduct the verification process such that the verification process is divided into the verification processing groups each having a group of the substrates corresponding to the holder portions and at least one of a substrate above and a substrate below the group of substrates.

13. The substrate transfer apparatus according to claim 4, wherein the transfer control component is configured to control the substrate transfer device such that the substrate transfer device does not unload a group of substrates in a verification processing group from the cassette when the verification processing group has a difference between maximum and minimum values verified to exceed the threshold value and that the substrate transfer device unloads a group of substrates in a verification processing group from the cassette when the verification processing group has a difference between maximum and minimum values verified to be equal to or less than the threshold value.

14. A substrate processing system, comprising:
a substrate transfer apparatus configured to load a plurality of substrates from outside;
a substrate processing apparatus configured to treat the substrates loaded by the substrate transfer apparatus; and
a delivery apparatus configured to deliver the substrates loaded by the substrate transfer apparatus to the substrate processing apparatus,
wherein the substrate transfer apparatus includes a substrate transfer device configured to load and unload the plurality of substrates into and from a cassette configured to accommodate the plurality of substrates, a substrate detector device configured to detect positions of the substrates accommodated in the cassette, and a control device configured to control the substrate transfer device, the control device includes a computation component configured to calculate a shifted amount between a base position and the position of each of the substrates detected by the substrate detector device such that the shifted amount of an upward or downward shift from the base position is set as a positive value, a verification component configured to verify whether a difference between maximum and minimum values among the shifted amounts calculated by the computation component is equal to or less than a threshold value, and a transfer control component configured to control the substrate transfer device such that the substrate transfer device unloads the substrates from the cassette when the verification component verifies that the difference between the maximum and minimum values is equal to or less than the threshold value.

15. The substrate processing system according to claim 14, wherein the control device has a correction component configured to correct an unloading target position in accordance with the shifted amount having a greatest absolute value, and the transfer control component is configured to control the substrate transfer device to unload the substrates from the cassette based on the unloading target position corrected by the correction component.

16. The substrate processing system according to claim 15, wherein the verification component is configured to conduct a verification process which is divided into a plurality of verification processing groups.

17. A method for unloading substrates, comprising:
detecting positions of a plurality of substrates accommodated in a cassette by a substrate detector device;
calculating a shifted amount between a base position and the position of each of the substrates detected by the substrate detector device such that the shifted amount of an upward or downward shift from the base position is set as a positive value;

verifying whether a difference between maximum and minimum values among the shifted amounts calculated by the computation component is equal to or less than a threshold value; and controlling a substrate transfer device such that the substrate transfer device unloads the substrates from the cassette when the verification component verifies that the difference between the maximum and minimum values is equal to or less than the threshold value.

18. The method for unloading substrates according to claim 17, further comprising:

correcting an unloading target position in accordance with the shifted amount having a greatest absolute value, wherein the controlling of the substrate transfer device includes controlling the substrate transfer device to unload the substrates from the cassette based on the unloading target position corrected by the correction component.

19. The method for unloading substrates according to claim 18, wherein the verifying comprises conducting a verification process which is divided into a plurality of verification processing groups.

20. A non-transitory computer readable medium including a program, which when executed by an information processing apparatus, causes the information processing apparatus to:

instruct the substrate detector device in the substrate transfer apparatus according to claim 1 to detect positions of the substrates accommodated in the cassette;

instruct the computation component of the control device to calculate the shifted amount between the base position and the position of each of the substrates detected by the substrate detector device such that the shifted amount of the upward or downward shift from the base position is set as a positive value;

instruct the verification component of the control device to verify whether the difference between the maximum and minimum values among the shifted amounts calculated by the computation component is equal to or less than the threshold value; and instruct the transfer control component of the control device to control the substrate transfer device such that the substrate transfer device unloads the substrates from the cassette when the verification component verifies that the difference between the maximum and minimum values is equal to or less than the threshold value.

\* \* \* \* \*